US012604446B2

(12) United States Patent
LoBianco et al.

(10) Patent No.: US 12,604,446 B2
(45) Date of Patent: Apr. 14, 2026

(54) INTEGRATED DEVICE PACKAGE WITH REDUCED THICKNESS

(71) Applicant: Skyworks Solutions, Inc., Irvine, CA (US)

(72) Inventors: Anthony James LoBianco, Irvine, CA (US); Hoang Mong Nguyen, Irvine, CA (US); Yi Liu, San Diego, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 165 days.

(21) Appl. No.: 18/190,844

(22) Filed: Mar. 27, 2023

(65) Prior Publication Data

US 2023/0345685 A1     Oct. 26, 2023

Related U.S. Application Data

(60) Provisional application No. 63/325,461, filed on Mar. 30, 2022, provisional application No. 63/325,469, filed on Mar. 30, 2022.

(51) Int. Cl.
| | |
|---|---|
| *H05K 9/00* | (2006.01) |
| *H01L 21/56* | (2006.01) |
| *H01L 23/544* | (2006.01) |
| *H01L 23/552* | (2006.01) |
| *H03H 9/64* | (2006.01) |

(52) U.S. Cl.
CPC ........... H05K 9/0022 (2013.01); H01L 21/56 (2013.01); H01L 23/544 (2013.01); H01L 23/552 (2013.01); *H01L 2223/54406* (2013.01); *H01L 2223/54413* (2013.01); *H01L 2223/5442* (2013.01); *H03H 9/64* (2013.01)

(58) Field of Classification Search
CPC ........ H05K 9/0022; H05K 9/00; H01L 21/56; H01L 23/544; H01L 23/552; H01L 2223/54406
USPC ........................................................ 361/748
See application file for complete search history.

(56) References Cited

U.S. PATENT DOCUMENTS

| | | | |
|---|---|---|---|
| 7,557,430 | B2 | 7/2009 | Barber et al. |
| 7,576,426 | B2 | 8/2009 | Gan et al. |
| 7,629,201 | B2 | 12/2009 | Gan et al. |
| 7,635,606 | B2 | 12/2009 | Warren et al. |
| 7,696,064 | B2 | 4/2010 | Gan et al. |
| 8,071,431 | B2 | 12/2011 | Hoang et al. |
| 8,399,972 | B2 | 3/2013 | Hoang et al. |
| 8,948,712 | B2 | 2/2015 | Chen et al. |
| 9,041,168 | B2 | 5/2015 | Hoang et al. |
| 9,041,472 | B2 | 5/2015 | Chen et al. |
| 9,054,115 | B2 | 6/2015 | Hoang et al. |

(Continued)

*Primary Examiner* — Tremesha W Burns
(74) *Attorney, Agent, or Firm* — Knobbe, Martens, Olson & Bear, LLP

(57) ABSTRACT

An integrated device package is disclosed. The integrated device package can include a carrier, an electronic component mounted on the carrier, a molding material disposed over the carrier, and an electromagnetic interference shield layer disposed over the molding material. The electronic component is at least partially disposed in the molding material. At least a portion of the shield layer is in contact with the electronic component. The electromagnetic interference shield layer is configured to shield the electronic component from a radio frequency signal. A surface of the electromagnetic interference shield layer includes an ink mark or a laser mark.

20 Claims, 10 Drawing Sheets

(56) References Cited

U.S. PATENT DOCUMENTS

| | | | |
|---|---|---|---|
| 9,071,335 B2 | 6/2015 | Agarwal et al. | |
| 9,202,747 B2 | 12/2015 | Chen et al. | |
| 9,202,748 B2 | 12/2015 | Lobianco et al. | |
| 9,203,529 B2 | 12/2015 | Chen et al. | |
| 9,214,387 B2 | 12/2015 | Chen et al. | |
| 9,252,107 B2 | 2/2016 | Read et al. | |
| 9,295,157 B2 | 3/2016 | Chen et al. | |
| 9,419,667 B2 | 8/2016 | Lobianco et al. | |
| 9,506,968 B2 | 11/2016 | Hoang et al. | |
| 9,515,029 B2 | 12/2016 | Chen et al. | |
| 9,564,937 B2 | 2/2017 | Lobianco et al. | |
| 9,576,911 B2 | 2/2017 | Lobianco et al. | |
| 9,646,936 B2 | 5/2017 | Chen et al. | |
| 9,653,409 B2 | 5/2017 | Read et al. | |
| 9,703,913 B2 | 7/2017 | Chen et al. | |
| 9,754,896 B2 | 9/2017 | Read et al. | |
| 9,871,599 B2 | 1/2018 | Chen et al. | |
| 9,955,582 B2 | 4/2018 | Kuhlman et al. | |
| 10,061,885 B2 | 8/2018 | Chen et al. | |
| 10,163,814 B2 | 12/2018 | Read et al. | |
| 10,192,785 B2 | 1/2019 | Liu et al. | |
| 10,200,077 B2 | 2/2019 | Liu et al. | |
| 10,242,143 B2 | 3/2019 | Chen et al. | |
| 10,256,535 B2 | 4/2019 | Nguyen et al. | |
| 10,276,521 B2 | 4/2019 | Babcock et al. | |
| 10,283,859 B2 | 5/2019 | Nguyen et al. | |
| 10,290,585 B2 | 5/2019 | Nguyen et al. | |
| 10,320,071 B2 | 6/2019 | Nguyen et al. | |
| 10,361,145 B2 | 7/2019 | Chen et al. | |
| 10,497,656 B2 | 12/2019 | Chen et al. | |
| 10,515,924 B2 | 12/2019 | Babcock et al. | |
| 10,524,350 B2 | 12/2019 | Lobianco et al. | |
| 10,529,669 B2 | 1/2020 | Nguyen et al. | |
| 10,530,050 B2 | 1/2020 | Nguyen et al. | |
| 10,579,766 B2 | 3/2020 | Chen et al. | |
| 10,580,741 B2 | 3/2020 | Read et al. | |
| 10,586,010 B2 | 3/2020 | Chen et al. | |
| 10,615,841 B2 | 4/2020 | Liu et al. | |
| 10,729,001 B2 | 7/2020 | Branchevsky et al. | |
| 10,771,101 B2 | 9/2020 | Lobianco et al. | |
| 10,797,002 B2 | 10/2020 | Nguyen et al. | |
| 10,931,009 B2 | 2/2021 | Nguyen et al. | |
| 10,980,106 B2 | 4/2021 | Lobianco et al. | |
| 11,037,893 B2 | 6/2021 | Wallis et al. | |
| 11,038,267 B2 | 6/2021 | Lobianco et al. | |
| 11,043,466 B2 | 6/2021 | Babcock et al. | |
| 11,063,002 B2 | 7/2021 | Nguyen et al. | |
| 11,069,978 B2 | 7/2021 | Hoang et al. | |
| 11,139,257 B2 | 10/2021 | Chen et al. | |
| 11,201,066 B2 | 12/2021 | Darveaux et al. | |
| 11,244,835 B2 | 2/2022 | Darveaux et al. | |
| 11,563,267 B2 | 1/2023 | Lobianco et al. | |
| 11,596,056 B2 | 2/2023 | Vijayakumar et al. | |
| 11,682,585 B2 | 6/2023 | Liu et al. | |
| 11,682,649 B2 | 6/2023 | Babcock et al. | |
| 11,864,295 B2 | 1/2024 | Soliman et al. | |
| 11,894,323 B2 | 2/2024 | Chen et al. | |
| 11,974,390 B2 | 4/2024 | Vijayakumar et al. | |
| 2006/0211233 A1 | 9/2006 | Gan et al. | |
| 2006/0220173 A1 | 10/2006 | Gan et al. | |
| 2007/0070608 A1 | 3/2007 | Warren et al. | |
| 2008/0064142 A1 | 3/2008 | Gan et al. | |
| 2009/0127695 A1 | 5/2009 | Kim et al. | |
| 2013/0323409 A1 | 12/2013 | Read et al. | |
| 2014/0083459 A1 | 3/2014 | Read et al. | |
| 2014/0087633 A1 | 3/2014 | Read et al. | |
| 2015/0255402 A1 | 9/2015 | Hoang et al. | |
| 2015/0255403 A1 | 9/2015 | Hoang et al. | |
| 2015/0326181 A1 | 11/2015 | Chen et al. | |
| 2015/0326182 A1 | 11/2015 | Chen et al. | |
| 2015/0326183 A1 | 11/2015 | Chen et al. | |
| 2016/0014935 A1 | 1/2016 | Agarwal et al. | |
| 2016/0181206 A1 | 6/2016 | Read et al. | |
| 2017/0301629 A1 | 10/2017 | Read et al. | |
| 2017/0301985 A1 | 10/2017 | Nguyen et al. | |
| 2018/0019212 A1 | 1/2018 | Read et al. | |
| 2018/0076148 A1 | 3/2018 | Nguyen et al. | |
| 2018/0096950 A1 | 4/2018 | Chen et al. | |
| 2018/0096951 A1 | 4/2018 | Chen et al. | |
| 2018/0226271 A1 | 8/2018 | Chen et al. | |
| 2018/0226361 A1 | 8/2018 | Chen et al. | |
| 2018/0233423 A1 | 8/2018 | Lobianco et al. | |
| 2018/0233457 A1* | 8/2018 | Chen | H01L 21/56 |
| 2018/0242455 A1 | 8/2018 | Kuhlman et al. | |
| 2018/0294558 A1 | 10/2018 | Hoang et al. | |
| 2018/0294569 A1 | 10/2018 | Hoang et al. | |
| 2019/0057929 A1 | 2/2019 | Chen et al. | |
| 2019/0198451 A1 | 6/2019 | Read et al. | |
| 2020/0013637 A1 | 1/2020 | Haba | |
| 2020/0075504 A1 | 3/2020 | Nguyen et al. | |
| 2020/0161222 A1 | 5/2020 | Chen et al. | |
| 2021/0143542 A1 | 5/2021 | Nguyen et al. | |
| 2021/0399423 A1 | 12/2021 | Hoang et al. | |
| 2022/0130686 A1 | 4/2022 | Darveaux et al. | |
| 2022/0310530 A1 | 9/2022 | Lobianco et al. | |
| 2022/0338342 A1 | 10/2022 | Branchevsky et al. | |
| 2023/0066774 A1* | 3/2023 | Nakagawa | H04B 1/38 |
| 2023/0115846 A1 | 4/2023 | Nguyen et al. | |
| 2023/0163458 A1 | 5/2023 | Lobianco et al. | |
| 2023/0215795 A1 | 7/2023 | Sailer et al. | |
| 2023/0215796 A1 | 7/2023 | Sailer et al. | |
| 2023/0262877 A1 | 8/2023 | Vijayakumar et al. | |
| 2023/0269866 A1 | 8/2023 | Ciou et al. | |
| 2023/0326841 A1 | 10/2023 | Darveaux et al. | |
| 2023/0345684 A1 | 10/2023 | LoBianco et al. | |
| 2023/0402293 A1 | 12/2023 | LoBianco et al. | |
| 2023/0402294 A1 | 12/2023 | LoBianco et al. | |
| 2023/0402338 A1 | 12/2023 | LoBianco et al. | |
| 2023/0420301 A1 | 12/2023 | Liu et al. | |
| 2024/0087999 A1 | 3/2024 | Wang et al. | |

* cited by examiner

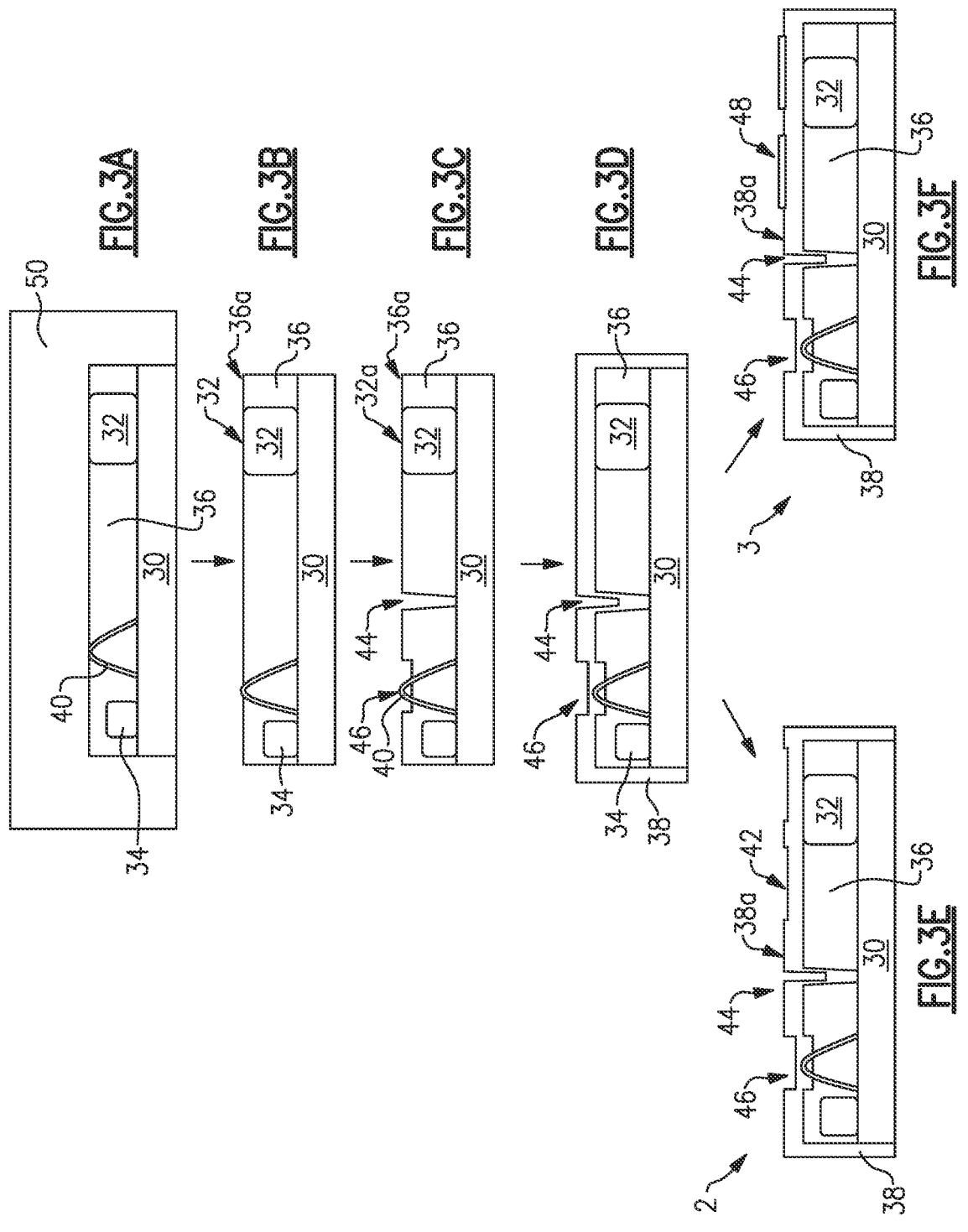

INTEGRATED DEVICE PACKAGE WITH REDUCED THICKNESS

INCORPORATION BY REFERENCE TO ANY PRIORITY APPLICATIONS

Any and all applications for which a foreign or domestic priority claim is identified in the Application Data Sheet as filed with the present application, including U.S. Provisional Patent Application No. 63/325,461, filed Mar. 30, 2022, titled "INTEGRATED DEVICE PACKAGE WITH REDUCED THICKNESS," and U.S. Provisional Patent Application No. 63/325,469, filed Mar. 30, 2022, titled "ELECTROMAGNETIC INTERFERENCE (EMI) SHIELDED INTEGRATED DEVICE PACKAGE," bare hereby incorporated by reference under 37 CFR 1.57 in their entirety.

BACKGROUND

Technical Field

The field relates to device packages, and in particular, to integrated device packages with a reduced thickness having a shielding layer.

Description of Related Technology

An integrated device package can include a plurality of components, such as integrated device dies (e.g., radio frequency (RF) dies), and passive components (e.g., inductors, resistors, capacitors, etc.). The components are typically mounted on a package substrate. The package substrate can be mounted to a system board. In some applications, it can be desired to provide a thin profile package, so as to enable the package to fit within small form-factor electronic devices and systems.

SUMMARY

The innovations described in the claims each have several aspects, no single one of which is solely responsible for its desirable attributes. Without limiting the scope of the claims, some prominent features of this disclosure will now be briefly described.

In one aspect, an integrated device package is disclosed. The integrated device package can include a carrier, an electronic component mounted to the carrier, a molding material disposed over the carrier, and an electromagnetic interference shield layer disposed over the molding material. The electronic component is at least partially disposed in the molding material. At least a portion of the shield layer is in contact with the electronic component. The electromagnetic interference shield layer is configured to shield the electronic component from a radio frequency. A surface of the electromagnetic interference shield layer includes an ink mark or a laser mark.

In one embodiment, the integrated device package further includes a ground connection extending between the carrier and the electromagnetic interference shield layer at least partially through the molding material. The molding material can include a through mold via that extends at least partially through a thickness of the molding material. The through mold via can be positioned between the electronic component and the ground connection. The integrated device package can further include a second electronic component mounted on the carrier such that the through mold via is positioned between the electronic component and the second electronic component. The through mold via can be filled with a conductive material. The through mold via can be filled with an electromagnetic interference shielding material. The ground connection can include a conductive wire.

In one embodiment, the carrier is an organic printed circuit board (PCB).

In one embodiment, the electronic component is an integrated device die or a passive component.

In one embodiment, the electronic component is an acoustic wave device. The electronic component can be a filter.

In one embodiment, the integrated device package further includes an acoustic wave device mounted on the carrier.

In one embodiment, the electromagnetic interference shield layer has a thickness in a range between 2 μm and 6 μm.

In one embodiment, the surface of the electromagnetic interference shield layer includes the ink mark. The ink mark can have a height in a range between 5 μm and 15 μm above the surface of the electromagnetic interference shield layer.

In one embodiment, the surface of the electromagnetic interference shield layer includes the laser mark. The laser mark can have a depth in a range between 1 μm and 2 μm into the electromagnetic interference shield layer from the surface of the electromagnetic interference shield layer.

In one embodiment, an upper surface of the molding material that is in contact with the electromagnetic shield layer has a flat surface.

In one aspect, an integrated device package is disclosed. The integrated device package can include a carrier, and an electronic component mounted to the carrier. The electronic component has a first surface facing the carrier and a second surface opposite the first surface. The integrated device package can include a molding material that is disposed over the carrier. The electronic component is at least partially disposed in the molding material. The molding material has a lower surface facing the carrier and an upper surface opposite the lower surface and coplanar with the second surface of the electronic component. The integrated device package can include an electromagnetic interference shield layer that is disposed over the molding material. The electromagnetic interference shield layer is configured to shield the electronic component from a radio frequency signal. A surface of the shield layer includes an ink mark or a laser mark.

In one embodiment, the integrated device package further includes a plurality of electronic components including the electronic component. The plurality of electronic components can have an acoustic wave filter. The carrier can be a printed circuit board (PCB).

In one embodiment, the electromagnetic interference shield layer has a thickness in a range between 2 μm and 6 μm. The surface of the electromagnetic interference shield layer can include the ink mark. The ink mark can have a height in a range between 5 μm and 15 μm above the surface of the electromagnetic interference shield layer.

In one embodiment, the electromagnetic interference shield layer has a thickness in a range between 2 μm and 6 μm. The surface of the electromagnetic interference shield layer can include the laser mark. The laser mark can have a depth in a range between 1 μm and 2 μm into the electromagnetic interference shield layer from the surface of the electromagnetic interference shield layer.

In one aspect, an integrated device package is disclosed. The integrated device package can include a carrier, an electronic component mounted to the carrier, a molding material disposed over the carrier, and an electromagnetic interference shield layer disclosed over the molding material. The electronic component is at least partially disposed in the molding material. The electromagnetic interference shield layer is configured to shield the electronic component from a radio frequency signal. The electromagnetic interference shield layer has a thickness in a range between 2 μm and 6 μm. A surface of the electromagnetic interference shield layer includes an ink mark. The ink mark has a height in a range between 5 μm and 15 μm above the surface of the electromagnetic interference shield layer.

In one embodiment, an upper surface of the electronic component and the electromagnetic interference shield layer is spaced apart by a gap in a range between 10 μm to 50 μm. The gap can be defined by a portion of the molding material. An upper surface of the molding material that contacts the electromagnetic interference shield layer can have a flat surface.

In one embodiment, at least a portion of the shield layer is in contact with the electronic component.

In one embodiment, the electromagnetic interference shield layer has the thickness in a range between 2 μm and 4 μm. The ink mark can have a height in a range between 7 μm and 12 μm above the surface of the electromagnetic interference shield layer.

In one embodiment, the integrated device package further includes a ground connection extending between the carrier and the electromagnetic interference shield layer at least partially through the molding material. The molding material can include a through mold via that extends at least partially through a thickness of the molding material. The through mold via can be positioned between the electronic component and the ground connection. The integrated device package can further include a second electronic component that is mounted on the carrier such that the through mold via is positioned between the electronic component and the second electronic component. The through mold via can be filled with a conductive material.

In one embodiment, the integrated device package further includes a plurality of electronic components including the electronic component. The plurality of electronic components can have an acoustic wave filter. The carrier can be a printed circuit board (PCB).

In one embodiment, the laser mark includes a logo, an alphanumeric character, or a human or computer readable character identifies the integrated device package.

In one aspect, an integrated device package is disclosed. The integrated device package can include a carrier, an electronic component mounted to the carrier, a molding material that is disposed over the carrier, and an electromagnetic interference shield layer disposed over the molding material. The electronic component at least partially disposed in the molding material. The electromagnetic interference shield layer is configured to shield the electronic component from a radio frequency signal. The electromagnetic interference shield layer has a thickness in a range between 2 μm and 6 μm. A surface of the electromagnetic interference shield layer includes a laser mark. The laser mark has a depth in a range between 1 μm and 2 μm into the electromagnetic interference shield layer from the surface of the electromagnetic interference shield layer.

In one embodiment, an upper surface of the electronic component and the electromagnetic interference shield layer is spaced apart by a gap in a range between 10 μm to 50 μm. The gap can be defined by a portion of the molding material.

An upper surface of the molding material that contacts the electromagnetic interference shield layer can have a flat surface.

In one embodiment, at least a portion of the shield layer is in contact with the electronic component.

In one embodiment, the electromagnetic interference shield layer has the thickness in a range between 2 μm and 4 μm.

In one embodiment, the integrated device package further includes a ground connection extending between the carrier and the electromagnetic interference shield layer at least partially through the molding material The molding material can include a through mold via that extends at least partially through a thickness of the molding material. The through mold via can be positioned between the electronic component and the ground connection. The integrated device package can further include a second electronic component mounted on the carrier such that the through mold via is positioned between the electronic component and the second electronic component. The through mold via can be filled with a conductive material.

In one embodiment, the integrated device package further includes a plurality of electronic components including the electronic component. The plurality of electronic components can have an acoustic wave filter. The carrier can be a printed circuit board (PCB).

In one embodiment, the laser mark includes a logo, an alphanumeric character, or a human or computer readable character identifies the integrated device package.

The present disclosure relates to U.S. patent application Ser. No. 18/190,844, titled "INTEGRATED DEVICE PACKAGE WITH REDUCED THICKNESS," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

FIGS. 3A to 3F show various steps of forming the integrated device packages of FIGS. 2A and 2B.

DETAILED DESCRIPTION OF CERTAIN EMBODIMENTS

Figure 1:
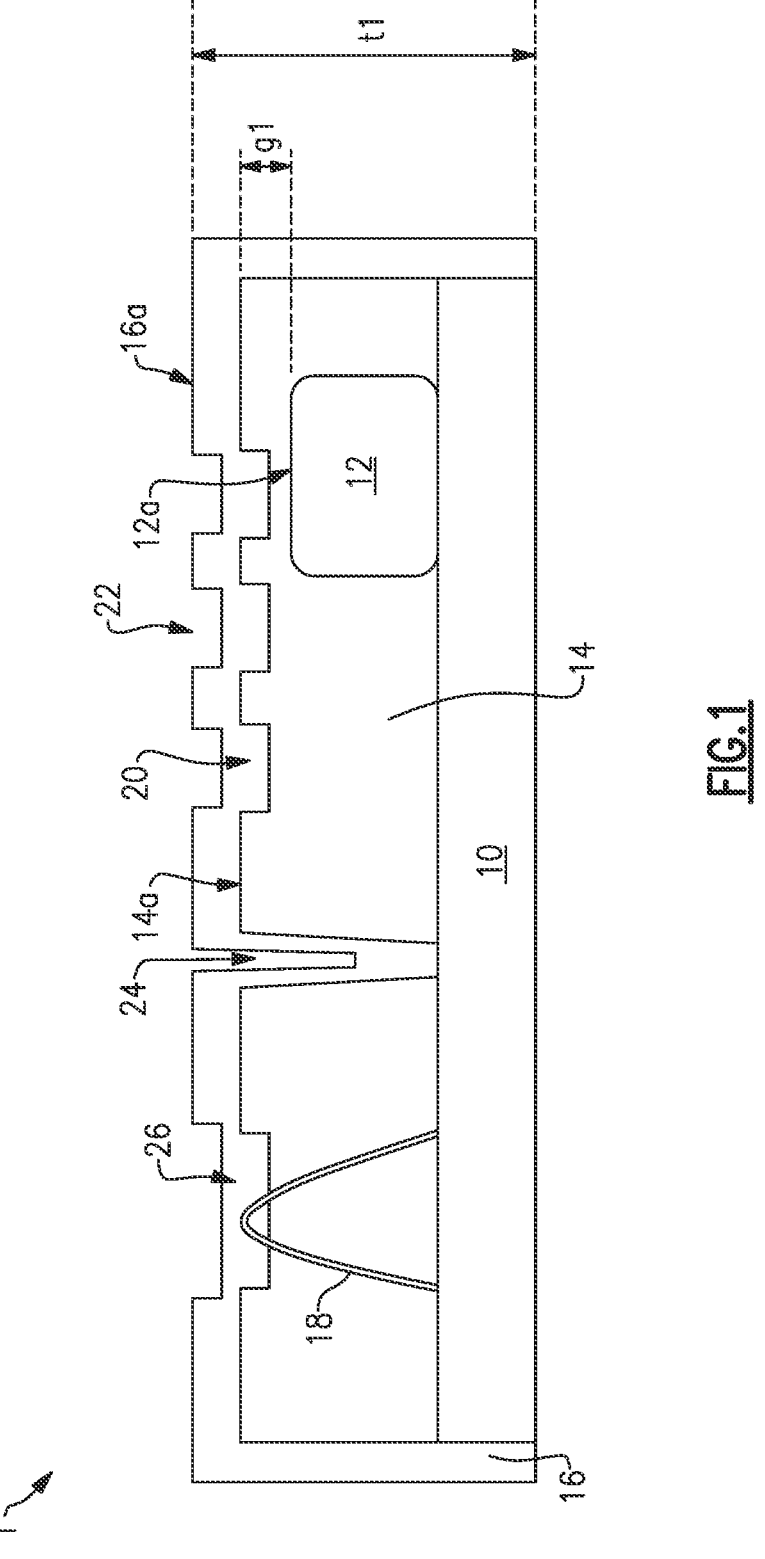
FIG. 1 is a schematic cross-sectional side view of an integrated device package.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

With the miniaturization of electronic devices, there is a demand for reducing a size of integrated device packages used in the electronic devices. Various embodiments disclosed herein relate to packages (e.g., integrated device packages) with a reduced thickness or low profile. An integrated device package can include one or more electronic components that are at least partially embedded in a molding material. A height of the integrated device package can be dependent at least in part on the tallest or thickest component amongst the one or more electronic components. Therefore, when designing the integrated device package, a height or thickness of the integrated device package can be driven by the tallest or thickest component. The integrated device package can have a marking. For example, the marking can include a logo, a number, or a human or computer readable character that can be used for alignment of the integrated device package and/or for identifying the integrated device package. The marking is visible on the integrated device package. Some integrated device package, such as an radio frequency (RF) device package, includes an electromagnetic interference (EMI) shield layer. The marking can be visible on the EMI shield layer. The integrated device package can be configured to couple to a system board or an external device.

FIG. 1 is a schematic cross-sectional side view of an integrated device package 1. The integrated device package 1 includes a carrier 10, an electronic component 12 mounted on the carrier 10, a molding material 14 over the carrier 10, an electromagnetic interference (EMI) shield layer 16, and a ground connection 18 connecting a ground layer of the carrier 10 and the EMI shield layer 14.

An upper surface 14a of the molding material 14 has a marking 20. The marking 20 can be covered at least in part by the EMI shield layer 16 thereby defining a visible marking 22 on an upper surface 16a of the EMI shield layer 16. For example, the marking 20 can be conformally covered by the EMI shield layer 16 thereby defining a visible marking 22 on an upper surface 16a of the EMI shield layer 16. In order to form the marking 20 on the upper surface 14a of the molding material 14, there is a gap g1 between an upper surface of the electronic component 12 and the upper surface 14a of the molding material 14. The marking 20 has a depth of about 30 μm to 40 μm, and the EMI shielding layer 16 can have a thickness of about 3 μm to 5 μm. The gap g can have a thickness that is sufficient for forming the marking 20 without damaging the electronic component 12. The gap g for the marking 20 can add significant thickness to the integrated device package 1 in some instances. For example, the gap g1 may be about 80 μm or more. The integrated device package 1 may have a thickness t1 in a range between, for example, 500 μm and 750 μm. Therefore, the gap g1 can constitute about 10% to 16% or more of the total thickness t of the integrated device package 1.

The integrated device package 1 can also include a through mold via 24 that can at least partially isolate portions of the molding material 14, and a recess 26 that can reveal the ground connection 18 for connecting the ground connection 18 and the EMI shield layer 16.

Figure 2A:
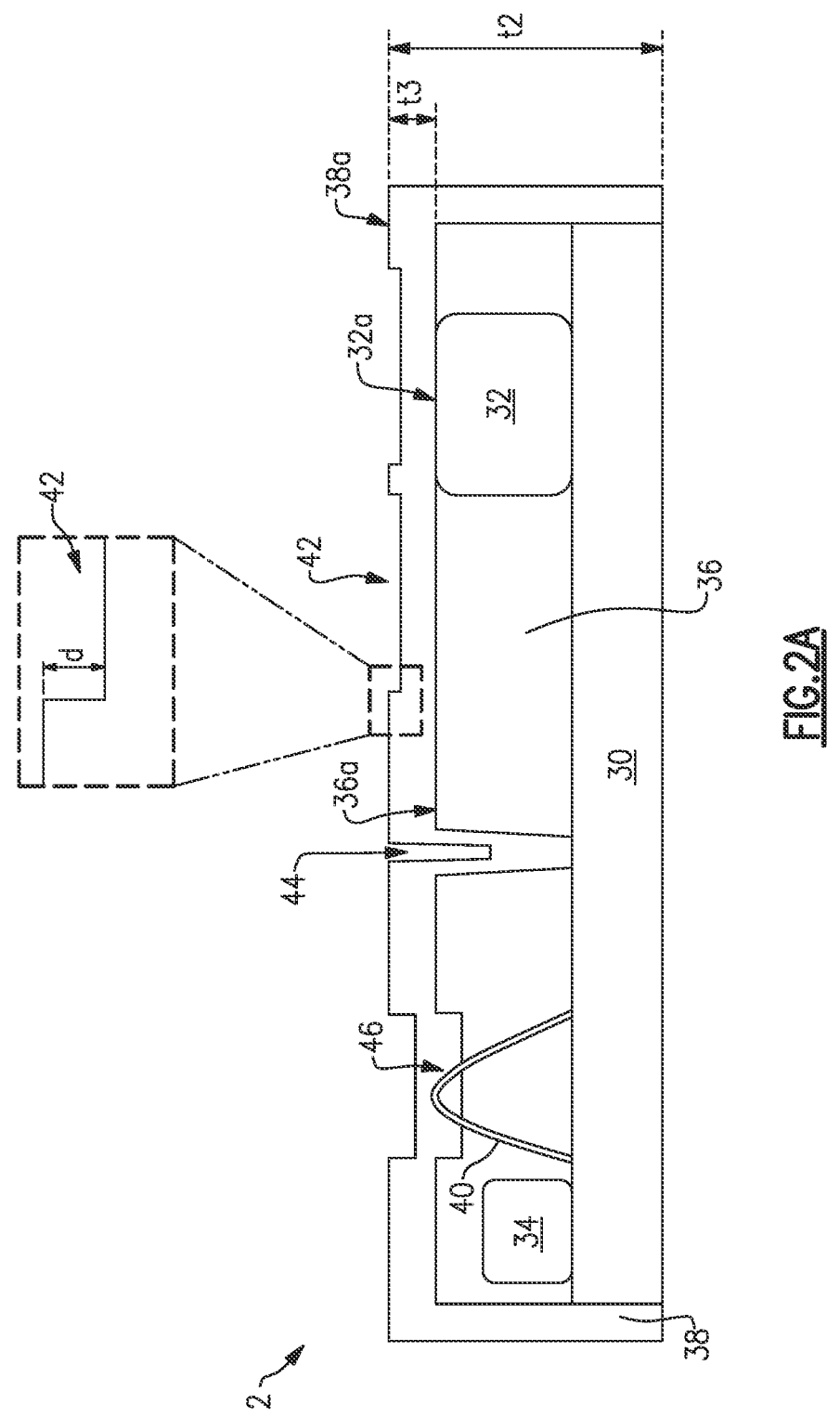
FIG. 2A is a schematic cross-sectional side view of an integrated device package according to an embodiment.

FIG. 2A is a schematic cross-sectional side view of an integrated device package 2 according to an embodiment. The integrated device package 2 can include a carrier 30, a first electronic component 32 mounted on the carrier 30, a second electronic component 34 mounted on the carrier 30, a molding material 36 disposed over the carrier 30 such that the first and second electronic components 32, 34 are at least partially within (e.g., embedded in) the molding material 36, an electromagnetic interference (EMI) shield layer 38 over the molding material 36, and a ground connection 40 connecting a ground layer of the carrier 30 and the EMI shield layer 38. The integrated device package 2 can include a marking 42 over the EMI shield layer 38.

The carrier 30 can include any suitable material. In some embodiments, the carrier 30 can be a printed circuit board (PCB). For example, the PCB can be an organic PCB. The carrier 30 can include a non-conductive material and a conductive interconnect structure (not shown) formed with or on the non-conductive material. The interconnect structure can include a conductive trace or line, conductive pad, the ground layer, and/or a conductive via.

The first and second electronic components 32, 34 can be mounted and electrically connected to the carrier 30. The first and second electronic components 32, 34 can include any suitable component, such as, a passive component (e.g., inductors, resistors, capacitors, etc.), an integrated device die (e.g., a radio frequency (RF) die), and/or an acoustic wave device (e.g., a filter). The first electronic component 32 and the second electronic component 34 can have different heights. For example, as shown in FIG. 2A, the first electronic component 32 can be taller or thicker than the second electronic component 34. The first electronic component 32 can be the tallest or thickest component included in the integrated device package 2. In such embodiments, a height or thickness of the integrated device package can be driven generally by the first electronic component 32.

The molding material 36 can include a through mold via 44. The through mold via 44 can provide a mechanical separation between portions of the molding material 36. The through mold via 44 can extend completely through a thickness of the molding material 36 as shown in FIG. 2A. In some other embodiments, the through mold via 44 can extend partially through the thickness of the molding material 36. The EMI shield layer 38 can be disposed at least partially over and/or in the through mold via 44. For example, the EMI shield layer 38 can be conformally disposed over and/or in the through mold via 44. In some embodiments, the through mold via 44 can be at least partially filled with an isolating material (see FIGS. 4 and 5).

In some embodiments, the through mold via 44 can electromagnetically separate or isolate the first electronic component 32 and the second electronic component 34.

The molding material 36 can include a recess 46. In some embodiments, the recess 46 can be formed by removing a portion of the molding material 36 thereby exposing the ground connection 40. The EMI shield layer 38 can be disposed at least partially over and/or in the recess 46. The EMI shield layer 38 can be conformally disposed over and/or in the recess 46. The EMI shield layer 38 can be in contact with the ground connection 40, and the ground connection 40 can provide ground connection between the carrier 30 and the EMI shield layer 38.

The molding material 36 has an upper surface 36a. The upper surface 36a of the molding material can have a flat surface. The upper surface 36a of the molding material has no marking (e.g., a logo, an alphanumeric character, or a human or computer readable character) formed thereon. The upper surface 36a can be coplanar or flush with an upper surface 32a of the first electronic component 32, in some embodiments. For example, the upper surface 32a of the first electronic component 32 can be exposed through the molding material 36. The EMI shield layer 38 can be disposed on and make contact with the supper surface 32a of the first electronic component 32 and the upper surface 36a of the molding material 36. Accordingly, in some embodiments, there is no gap between the upper surface 36a and the EMI shield layer 38. In some other embodiments, a portion of the molding material 36 having a relatively small thickness can be disposed between the upper surface 32a of the first electronic component 32 and the EMI shield layer 38.

The EMI shield layer 38 can shield the first electronic component 32 and/or the second electronic component 34 from a radio frequency (RF) signal. For example, the EMI shield layer 38 can shield the first electronic component 32 and/or the second electronic component 34 from signals emitted from and/or received by an RF device associated with the integrated device package 2. The EMI shield layer 38 can be formed by way of deposition (e.g., a physical vapor deposition (PVD)). For example, the EMI shield layer 38 can be formed by sputtering the EMI shield material over the molding material 36. The EMI shield layer 38 can include any suitable EMI shield materials. For example, the EMI shield material can include aluminum, copper, steel, etc.

An upper surface 38a of the EMI shield layer 38 can have a marking 42. For example, the marking 42 can include a logo, an alphanumeric character, or a human or computer readable character that can be used for alignment of the integrated device package 2 and/or for identifying the integrated device package 2. For example, the marking 42 can be used for identifying a type of the integrated device package 2. A skilled artisan will understand that a marking disclosed herein may not encompass scratches or scars signature of, for example, a grinding process, that do not indicate the information about the integrated device package 2. The marking 42 can be visible on the integrated device package 2. The marking 42 can be formed by removing at least a portion of the EMI shield layer 38 from the upper surface 38a. In some embodiments, the marking 42 can be a laser marked (e.g., etched) marking having a structural indication, such as a laser groove, of a laser marking process.

The integrated device package 2 has a thickness t2, and the EMI shield layer 38 has a thickness t3. The thickness t2 of the integrated device package 2 can be in a range between, for example, 420 μm and 670 μm. The thickness t3 of the EMI shield layer 38 can be in a range between, for example, 2 μm and 6 μm, 3 μm and 6 μm, 4 μm and 6 μm, or 3 μm and 5 μm. The marking 42 has a depth d that extends partially through a thickness of the EMI shield layer 38. The depth d can be sufficiently deep to be visible on the upper surface 38a of the EMI shield layer 38. The depth d of the marking 42 can be in a range between, for example, 1 μm and 3 μm, 1 μm and 2 μm, 1.5 μm and 3 μm, or 1.5 μm to 2 μm. The depth d of the marking 42 in these ranges can be significant in providing a visible marking while providing a relatively thin integrated device package 2.

The integrated device package 2 does not require the gap g1 that is present in the integrated device package 1 of FIG. 1 thereby enabling the integrated device package 2 to have a reduced thickness.

Figure 2B:
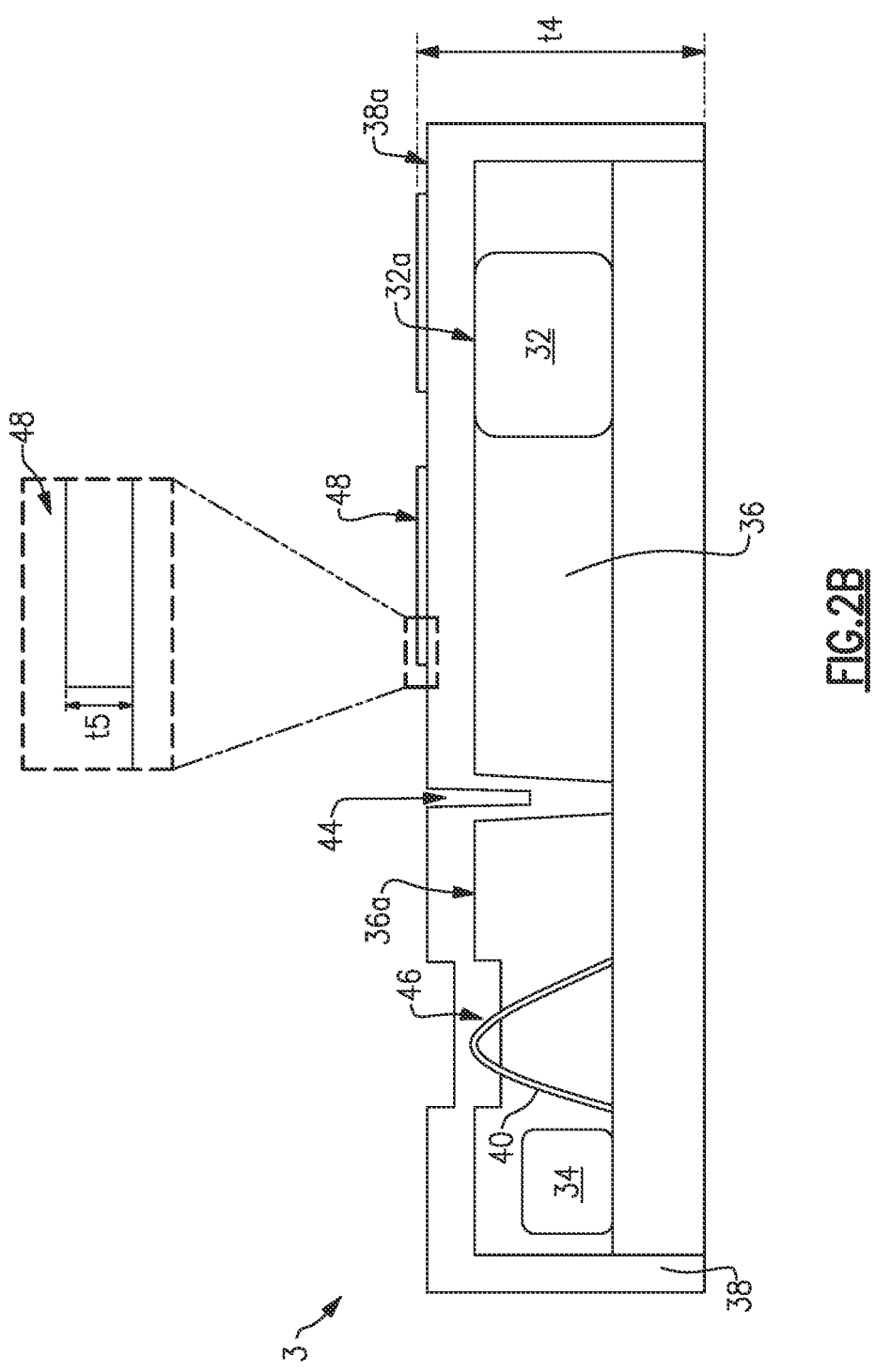
FIG. 2B is a schematic cross-sectional side view of an integrated device package according to another embodiment.

FIG. 2B is a schematic cross-sectional side view of an integrated device package 3 according to an embodiment. Unless otherwise noted, the components of FIG. 2B may be similar to or the same as like components of FIG. 2A. The integrated device package 3 is generally similar to the integrated device package 2 of FIG. 2A except that the integrated device package 3 includes an ink marking 48 in place of the marking 42.

The integrated device package 3 can include a carrier 30, a first electronic component 32 mounted on the carrier 30, a second electronic component 34 mounted on the carrier 30, a molding material 36 disposed over the carrier 30 such that the first and second electronic components 32, 34 are at least partially within (e.g., embedded in) the molding material 36, an electromagnetic interference (EMI) shield layer 38 over the molding material 36, and a ground connection 40 connecting a ground layer of the carrier 30 and the EMI shield layer 38. The ink marking 48 can be disposed on the upper surface 38a of the EMI shield layer 38.

The integrated device package 3 has a thickness t4, and the ink marking 48 has a thickness t5. The thickness t4 of the integrated device package 3 can be in a range between, for example, 425 μm and 685 μm. The thickness t5 of the ink marking 48 can be in a range between, for example, 5 μm to 15 μm, 8 μm to 15 μm, or 5 μm to 12 μm. The thickness t5 of the ink marking 48 in these ranges can be significant in providing a visible marking while providing a relatively thin integrated device package 3.

The integrated device package 3 does not require the gap g1 that is present in the integrated device package 1 of FIG. 1 thereby enabling the integrated device package 3 to have a reduced thickness.

FIGS. 3A to 3F show various steps of forming the integrated device packages 2, 3 according to some embodiments. Unless otherwise noted, the components of FIGS. 3A-3F may be similar to or the same as like components of FIGS. 2A and 2B. A method of forming the integrated device package 2 and a method of forming the integrated device package 3 can have similar steps as shown in FIGS. 3A to 3D.

FIG. 3A is a step in the method of forming the integrated device package 2, 3. In FIG. 3A, a mold structure 50 can be provided to define at least a portion of an outer boundary of the molding material 36. The molding material 36 can be provided in an opening of the mold structure 50. In some embodiments, as shown in FIG. 3A, at least a portion of the molding structure 50 can be in contact with the upper surface 32a of the first electronic component 32.

The mold structure 50 can be removed as shown in FIG. 3B. In some embodiments, the upper surface 36a of the molding material 36 can be coplanar or flush with the upper surface 32a of the first electronic component 32. The upper surface 32a of the first electronic component 32 can be exposed through the molding material 36.

In FIG. 3C, portions of the molding material 36 can be removed to define a through mold via 44 and/or a recess 46. The through mold via 44 can extend partially or completely through a thickness of the molding material 36. The recess 46 can reveal at least a portion of the ground connection 40.

At FIG. 3D, the EMI shield layer 38 can be formed. The EMI shield layer 38 can be formed by way of deposition (e.g., a physical vapor deposition (PVD)). For example, the EMI shield layer 38 can be formed by sputtering the EMI shield material over the molding material 36. The EMI shield layer 38 may be conformally deposited in the through mold via 44 and/or the recess 46. The EMI shield layer 38 can contact the ground connection 40.

At FIG. 3E, at least a portion of the EMI shield layer 38 can be removed to define the marking 42. In some embodiments, the portion of the EMI shield layer 38 can be removed by way of a laser removing process. For example, the portion of the EMI shield layer 38 can be removed by way of a laser etching. The removal process can be controlled so as to form a visible marking on the upper surface 38a of the EMI shield layer 38 without penetrating through the thickness t3 (see FIG. 2A) of the EMI shield layer 38.

At FIG. 3F, the ink marking 48 can be formed. The ink marking 48 can be visible on the upper surface 38a of the EMI shield layer 38. The thickness t5 (see FIG. 2B) of the ink marking 48 can be controlled so as to form a visible marking without significantly increasing the overall thickness of the integrated device package 3.

Figure 4:
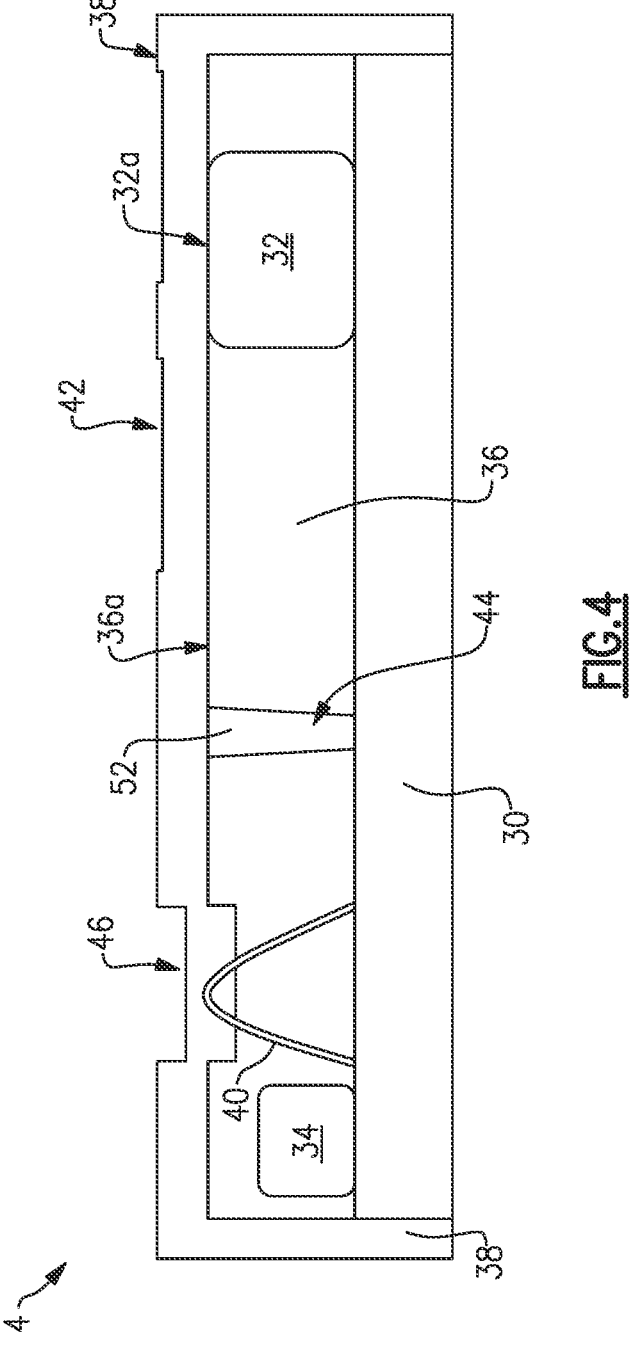
FIG. 4 is a schematic cross-sectional side vice of an integrated device package according to an embodiment.
Figure 5:
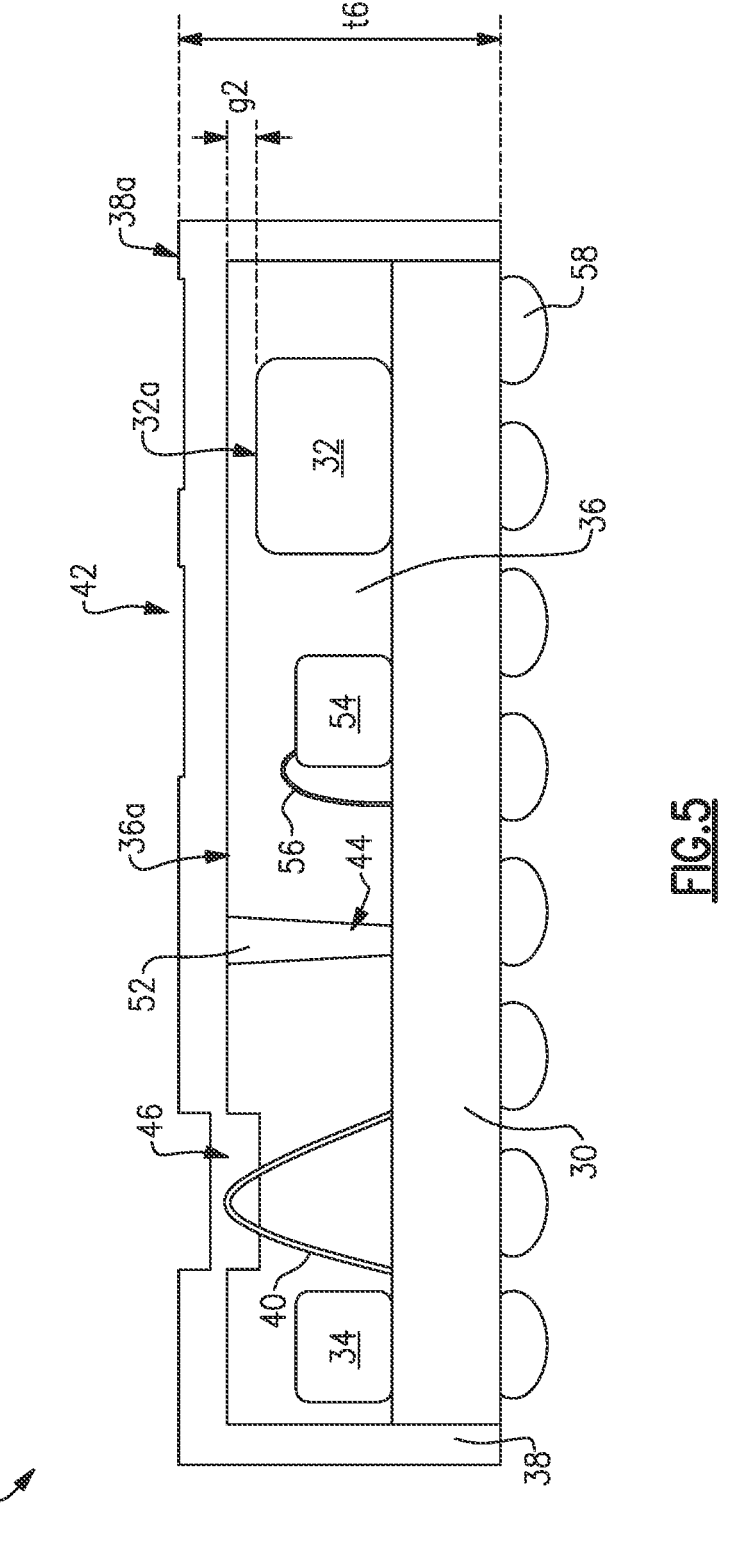
FIG. 5 is a schematic cross-sectional side vice of an integrated device package according to another embodiment.

Any of the principles and advantages disclosed herein can be used individually or combined together. For example, an integrated device package can include both the marking 42 and the ink marking 48. FIGS. 4 and 5 illustrate various features that can be used independently, or in combination with any of the principles and advantages disclosed herein.

FIG. 4 is a schematic cross-sectional side view of an integrated device package 4 according to an embodiment. Unless otherwise noted, the components of FIG. 4 may be similar to or the same as like components of FIGS. 2A-3F. The integrated device package 4 is generally similar to the integrated device package 2 of FIG. 2A except that the integrated device package 4 includes a isolating material 52 disposed in the through mold via 44 formed in the molding material 36. The isolating material 52 can include an electromagnetic interference (EMI) shielding material. In some embodiments, the isolating material 52 can be a conductive material. The isolating material 52 can facilitate electromagnetic isolation between portions of the molding material 36.

FIG. 5 is a schematic cross-sectional side view of an integrated device package 5 according to an embodiment. Unless otherwise noted, the components of FIG. 5 may be similar to or the same as like components of FIGS. 2A-4. The integrated device package 5 is generally similar to the integrated device package 4 of FIG. 4 except that the integrated device package 5 further includes a third electronic component 54, solder balls 58, and a gap g2 between the upper surface 32a of the first electronic component 32.

The third electronic component 54 can be wire bonded to the carrier 30 through a bond wire 56. The electronic components (e.g., the first to third electronic components 32, 34, 54) in the integrated device package 5 can be mounted to the carrier in any suitable manner. For example, one or more of the electronic components can be flip chip mounted to the carrier, while other electronic components can be wire bonded to the carrier. The third electronic component 54 can include any suitable component, such as, a passive component (e.g., inductors, resistors, capacitors, etc.), an integrated device die (e.g., a radio frequency (RF) die), and/or an acoustic wave device (e.g., a filter).

The integrated device package 5 can be electrically and/or mechanically coupled to a larger system or an external device. For example, the integrated device package 5 can be electrically and/or mechanically coupled to a larger system or an external device by way of the solder balls 58.

The integrated device package 5 has a thickness t6. In some embodiments, the thickness t6 of the integrated device package 5 can be smaller than the thickness t1 of the integrated device package 1 and greater than the thickness t2 of the integrated device package 2. The gap g2 of the integrated device package 5 can be smaller than the gap g1 of the integrated device package 1. In some embodiments, the thickness t6 of the integrated device package 5 can be in a range between, for example, 430 μm and 680 μm. In some embodiments, the gap g2 can be in a range between, for example, 10 μm and 60 μm, 20 μm and 60 μm, 10 μm and 50 μm, 10 μm and 40 μm, or 10 μm and 30 μm. The gap g2 of the integrated device package 5 in these ranges can be significant in providing a relatively thin integrated device package 5.

The upper surface 36a of the molding material has no marking (e.g., a logo, an a lphanumeric character, or a human or computer readable character) formed thereon. A skilled artisan will understand that a marking disclosed herein may not encompass scratches or scars signature of, for example, a grinding process, that do not indicate the information about the integrated device package 5. Unlike the integrated device package 1, because the upper surface 36a of the molding material does not include any marking, the gap g2 of the integrated device package 5 can be significantly smaller than the gap g1 of the integrated device package 1.

Figure 6:
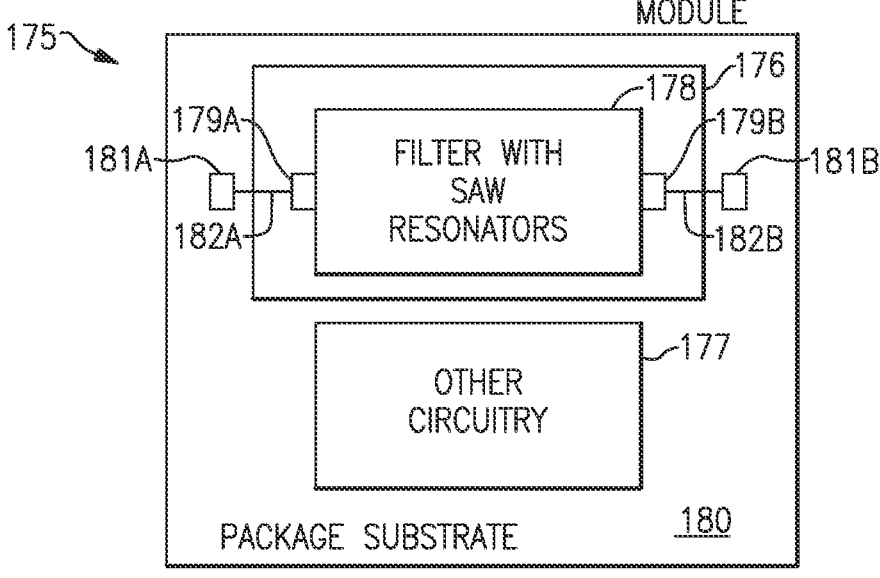
FIG. 6 is a schematic diagram of a radio frequency module that includes a surface acoustic wave resonator.

FIG. 6 is a schematic diagram of a radio frequency module 175 that includes a surface acoustic wave component 176. The radio frequency module 175 can be partially or fully packaged in accordance with any suitable principles and advantages discussed herein. The illustrated radio frequency module 175 includes the SAW component 176 and other circuitry 177. The SAW component 176 can include a SAW die that includes SAW resonators.

The SAW component 176 shown in FIG. 6 includes a filter 178 and terminals 179A and 179B. The filter 178 includes SAW resonators. One or more of the SAW resonators can be implemented. The terminals 179A and 178B can serve, for example, as an input contact and an output contact. The SAW component 176 and the other circuitry 177 are on a common packaging substrate 180 in FIG. 6. The package substrate 180 can be a laminate substrate. The terminals 179A and 179B can be electrically connected to contacts 181A and 181B, respectively, on the packaging substrate 180 by way of electrical connectors 182A and 182B, respectively. The electrical connectors 182A and 182B can be bumps or wire bonds, for example. The other circuitry 177 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 175 can include one or more packaging structures to, for example, provide protection and/or facilitate easier handling of the radio frequency module 175. Such a packaging structure can include an overmold structure formed over the packaging substrate

180. The overmold structure can encapsulate some or all of the components of the radio frequency module 175.

Figure 7:
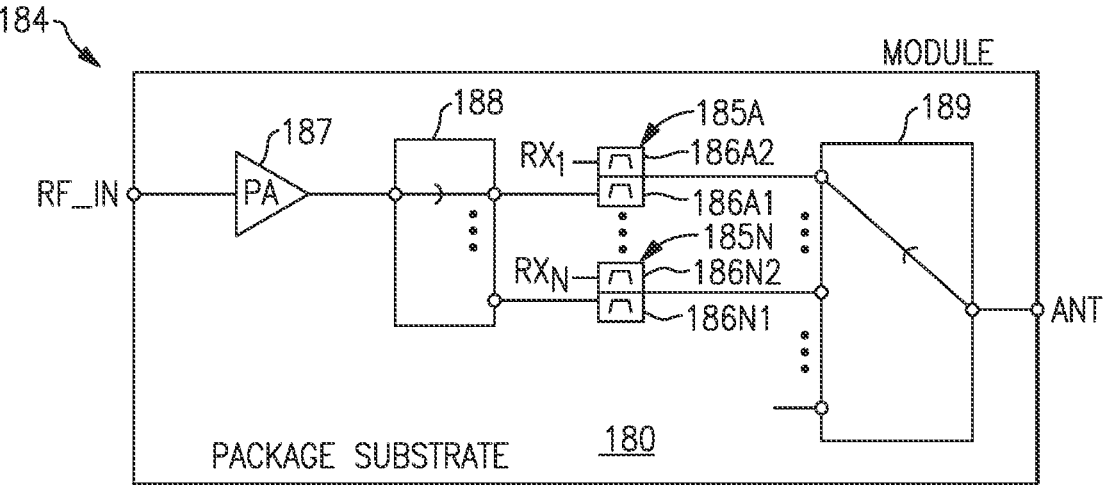
FIG. 7 is a schematic diagram of a radio frequency module that includes filters with surface acoustic wave resonators.

FIG. 7 is a schematic diagram of a radio frequency module 184 that includes a surface acoustic wave resonator. The radio frequency module 184 can be partially or fully packaged in accordance with any suitable principles and advantages discussed herein. As illustrated, the radio frequency module 184 includes duplexers 185A to 185N that include respective transmit filters 186A1 to 186N1 and respective receive filters 186A2 to 186N2, a power amplifier 187, a select switch 188, and an antenna switch 189. In some instances, the module 184 can include one or more low noise amplifiers configured to receive a signal from one or more receive filters of the receive filters 186A2 to 186N2. The radio frequency module 184 can include a package that encloses the illustrated elements. The illustrated elements can be disposed on a common packaging substrate 180. The packaging substrate can be a laminate substrate, for example.

The duplexers 185A to 185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 186A1 to 186N1 can include one or more SAW resonators. Similarly, one or more of the receive filters 186A2 to 186N2 can include one or more SAW resonators. Although FIG. 7 illustrates duplexers, any suitable principles and advantages disclosed herein can be implemented in other multiplexers (e.g., quadplexers, hexaplexers, octoplexers, etc.) and/or in switch-plexers and/or to standalone filters.

The power amplifier 187 can amplify a radio frequency signal. The illustrated switch 188 is a multi-throw radio frequency switch. The switch 188 can electrically couple an output of the power amplifier 187 to a selected transmit filter of the transmit filters 186A1 to 186N1. In some instances, the switch 188 can electrically connect the output of the power amplifier 187 to more than one of the transmit filters 186A1 to 186N1. The antenna switch 189 can selectively couple a signal from one or more of the duplexers 185A to 185N to an antenna port ANT. The duplexers 185A to 185N can be associated with different frequency bands and/or different modes of operation (e.g., different power modes, different signaling modes, etc.).

Figure 8:
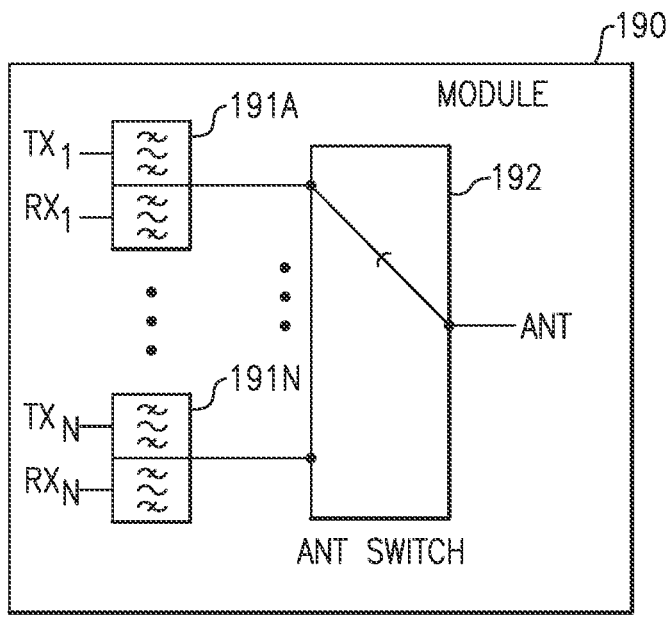
FIG. 8 is a schematic block diagram of a module that includes an antenna switch and duplexers that include a surface acoustic wave resonator.

FIG. 8 is a schematic block diagram of a module 190 that includes duplexers 191A to 191N and an antenna switch 192. The module 190 can be partially or fully packaged in accordance with any suitable principles and advantages discussed herein. One or more filters of the duplexers 191A to 191N can include any suitable number of surface acoustic wave resonators. Any suitable number of duplexers 191A to 191N can be implemented. The antenna switch 192 can have a number of throws corresponding to the number of duplexers 191A to 191N. The antenna switch 192 can electrically couple a selected duplexer to an antenna port of the module 190.

Figure 9A:
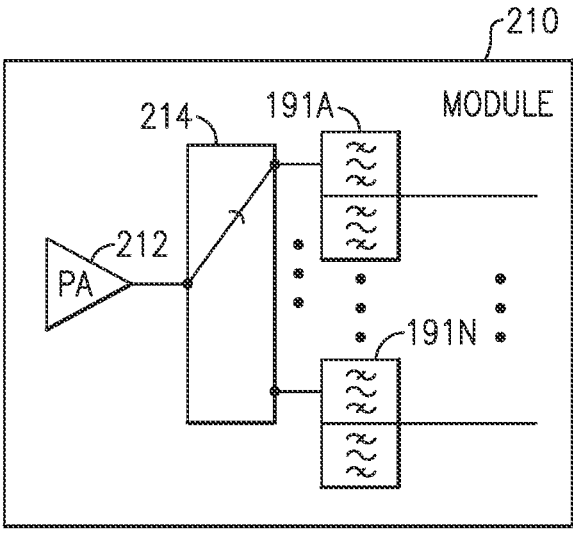
FIG. 9A is a schematic block diagram of a module that includes a power amplifier, a radio frequency switch, and duplexers that include a surface acoustic wave resonator.

FIG. 9A is a schematic block diagram of a module 210 that includes a power amplifier 212, a radio frequency switch 214, and duplexers 191A to 191N. The module 210 can be partially or fully packaged in accordance with any suitable principles and advantages discussed herein. The power amplifier 212 can amplify a radio frequency signal. The radio frequency switch 214 can be a multi-throw radio frequency switch. The radio frequency switch 214 can electrically couple an output of the power amplifier 212 to a selected transmit filter of the duplexers 191A to 191N. One or more filters of the duplexers 191A to 191N can include any suitable number of surface acoustic wave resonators. Any suitable number of duplexers 191A to 191N can be implemented.

Figure 9B:
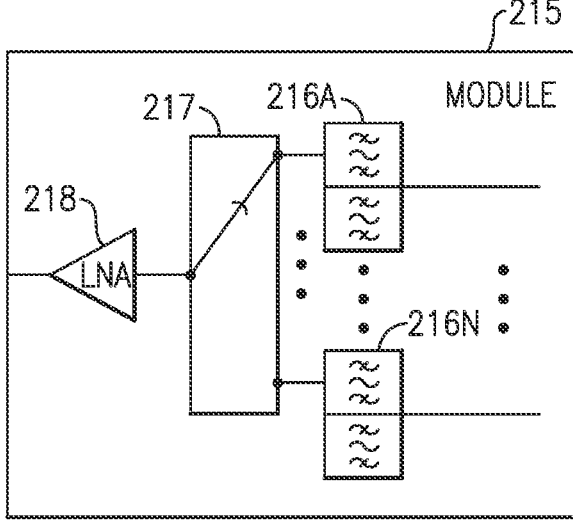
FIG. 9B is a schematic block diagram of a module that includes filters, a radio frequency switch, and a low noise amplifier.

FIG. 9B is a schematic block diagram of a module 215 that includes filters 216A to 216N, a radio frequency switch 217, and a low noise amplifier 218. The module 215 can be packaged in accordance with any suitable principles and advantages discussed herein. One or more filters of the filters 216A to 216N can include any suitable number of acoustic wave resonators. Any suitable number of filters 216A to 216N can be implemented. The illustrated filters 216A to 216N are receive filters. In some embodiments (not illustrated), one or more of the filters 216A to 216N can be included in a multiplexer that also includes a transmit filter. The radio frequency switch 217 can be a multi-throw radio frequency switch. The radio frequency switch 217 can electrically couple an output of a selected filter of filters 216A to 216N to the low noise amplifier 218. In some embodiments (not illustrated), a plurality of low noise amplifiers can be implemented. The module 215 can include diversity receive features in certain applications.

Figure 10A:
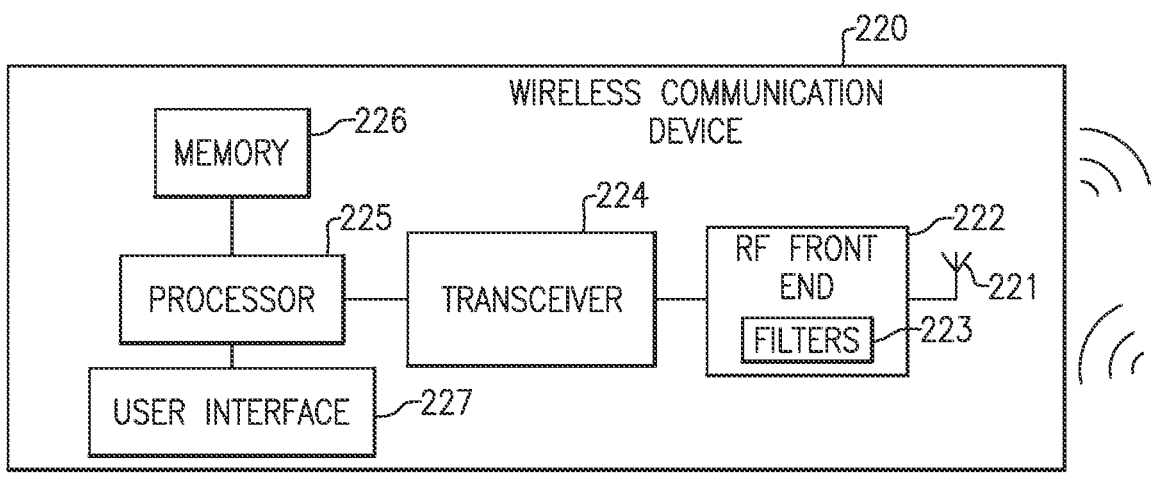
FIG. 10A is a schematic block diagram of a wireless communication device that includes a filter with a surface acoustic wave resonator.

FIG. 10A is a schematic diagram of a wireless communication device 220 that includes filters 223 in a radio frequency front end 222. The wireless communication device 220 can be packaged in accordance with any suitable principles and advantages discussed herein. The filters 223 can include one or more SAW resonators. The wireless communication device 220 can be any suitable wireless communication device. For instance, a wireless communication device 220 can be a mobile phone, such as a smart phone. As illustrated, the wireless communication device 220 includes an antenna 221, an RF front end 222, a transceiver 224, a processor 225, a memory 226, and a user interface 227. The antenna 221 can transmit/receive RF signals provided by the RF front end 222. Such RF signals can include carrier aggregation signals. Although not illustrated, the wireless communication device 220 can include a microphone and a speaker in certain applications.

The RF front end 222 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 222 can transmit and receive RF signals associated with any suitable communication standards.

The transceiver 224 can provide RF signals to the RF front end 222 for amplification and/or other processing. The transceiver 224 can also process an RF signal provided by a low noise amplifier of the RF front end 222. The transceiver 224 is in communication with the processor 225. The processor 225 can be a baseband processor. The processor 225 can provide any suitable base band processing functions for the wireless communication device 220. The memory 226 can be accessed by the processor 225. The memory 226 can store any suitable data for the wireless communication device 220. The user interface 227 can be any suitable user interface, such as a display with touch screen capabilities.

Figure 10B:
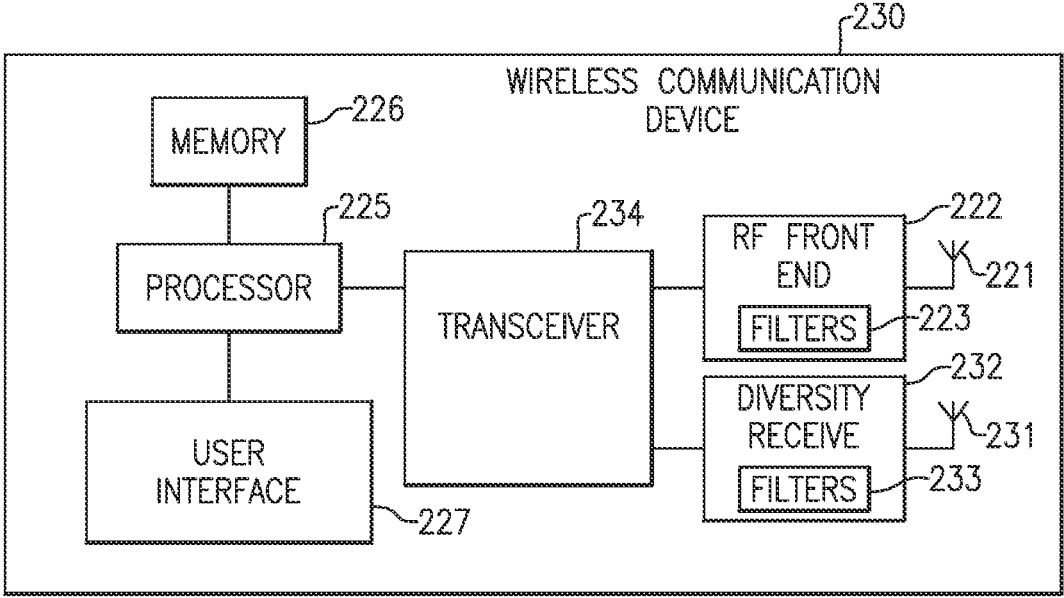
FIG. 10B is a schematic block diagram of another wireless communication device that includes a filter with a surface acoustic wave resonator.

FIG. 10B is a schematic diagram of a wireless communication device 230 that includes filters 223 in a radio frequency front end 222 and a second filter 233 in a diversity receive module 232. The wireless communication device 230 can be packaged in accordance with any suitable principles and advantages discussed herein. The wireless communication device 230 is like the wireless communication device 200 of FIG. 10A, except that the wireless communication device 230 also includes diversity receive features. As illustrated in FIG. 10B, the wireless communication device 230 includes a diversity antenna 231, a diversity module 232 configured to process signals received by the diversity antenna 231 and including filters 233, and a transceiver 234 in communication with both the radio frequency front end 222 and the diversity receive module 232. The filters 233 can include one or more SAW resonators.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz. Acoustic wave resonators and/or filters disclosed herein can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as packaged radio frequency modules and/or packaged filter components, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. As used herein, the term "approximately" intends that the modified characteristic need not be absolute, but is close enough so as to achieve the advantages of the characteristic. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word:

any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An integrated device package comprising:
a carrier;
at least first and second electronic components mounted to the carrier;
a molding material disposed over the carrier, the molding material surrounding and between the first and second electronic components, the first electronic component embedded within the molding material, the second electronic component disposed in the molding material with an upper surface of the second electronic component coplanar with an upper surface of the molding material;
a ground connection embedded within the molding material that extends from the carrier to a recess in the upper surface of the molding material, the ground connection positioned in the molding material between the first and second electronic components;
a through mold via positioned in the molding material between the ground connection and the second electronic component to provide mechanical separation between a first portion of the molding material surrounding the first electronic component and a second portion of the molding material surrounding the second electronic component; and
an electromagnetic interference shield layer disposed over the first and second electronic components, the recess, and the through mold via, at least a portion of the electromagnetic interference shield layer in contact with the ground connection exposed in the recess, the electromagnetic interference shield layer configured to shield the first and second electronic components from a radio frequency, an upper surface of the electromagnetic interference shield layer having a plurality of recesses, the plurality of recesses including markings.

2. The integrated device package of claim 1 wherein the upper surface of the molding material has a plurality of recesses that include markings.

3. The integrated device package of claim 2 wherein the electromagnetic interference shield layer is disposed over the plurality of recesses in the upper surface of the molding material to form the plurality of recesses in the electromagnetic interference shield layer.

4. The integrated device package of claim 3 wherein the first electronic component is not as high as the second electronic component.

5. The integrated device package of claim 4 wherein the through mold via is filled with a conductive material.

6. The integrated device package of claim 4 wherein the through mold via is filled with an electromagnetic interference shielding material.

7. The integrated device package of claim 2 wherein the ground connection includes a conductive wire.

8. The integrated device package of claim 1 wherein the carrier is an organic printed circuit board (PCB).

9. The integrated device package of claim 1 wherein the first electronic component is an integrated device die or a passive component.

10. The integrated device package of claim 1 wherein the first electronic component is an acoustic wave device.

11. The integrated device package of claim 10 wherein the first electronic component is a filter.

12. The integrated device package of claim 1 further comprising an acoustic wave device mounted on the carrier.

13. The integrated device package of claim 1 wherein the electromagnetic interference shield layer is conformally disposed over and in the through mold via.

14. The integrated device package of claim 1 wherein the through mold via is partially filed with an isolating material.

15. The integrated device package of claim 1 wherein the markings in the electromagnetic interference shield layer comprise ink with a thickness that exceeds a depth of the plurality of recesses.

16. The integrated device package of claim 1 wherein an upper surface of the molding material that is in contact with the electromagnetic interference shield layer has a flat surface.

17. A integrated device package comprising:
a carrier;

at least a first and second electronic components mounted to the carrier, the first and second electronic components having a first surface facing the carrier and a second surface opposite the first surface;

a molding material disposed over the carrier, the molding material surrounding and between the first and second electronic components, the first electronic component embedded within the molding material, the second electronic component disposed in the molding material, the molding material having a lower surface facing the carrier and an upper surface opposite the lower surface and coplanar with the second surface of the second electronic component;

a ground connection embedded within the molding material that extends from the carrier to a recess in the upper surface of the molding material, the ground connection positioned in the molding material between the first and second electronic components;

a through mold via positioned in the molding material between the ground connection and the second electronic component to provide mechanical separation between a first portion of the molding material surrounding the first electronic component and a second portion of the molding material surrounding the second electronic component; and an electromagnetic interference shield layer disposed over the first and second electronic components, the recess, and the through mold via, the electromagnetic interference shield layer in contact with the ground connection exposed in the recess, the electromagnetic interference shield layer configured to shield the first and second electronic components from a radio frequency signal, an upper surface of the electromagnetic interference shield layer having a plurality of recesses, the plurality of recesses including markings.

18. The integrated device package of claim 17 wherein the first and second electronic components have an acoustic wave filter, and wherein the carrier is a printed circuit board (PCB).

19. The integrated device package of claim 17 wherein the upper surface of the molding material has a plurality of recesses that include markings.

20. The integrated device package of claim 19 wherein the electromagnetic interference shield layer is disposed over the plurality of recesses in the upper surface of the molding material to form the plurality of recesses in the electromagnetic interference shield layer.

* * * * *